United States Patent [19]

Bingham

[11] Patent Number: 5,617,051
[45] Date of Patent: Apr. 1, 1997

[54] VOLTAGE OVERSHOOT LIMITER

[75] Inventor: David Bingham, San Jose, Calif.

[73] Assignee: Maxim Integrated Products, Sunnyvale, Calif.

[21] Appl. No.: 493,493

[22] Filed: Jun. 22, 1995

[51] Int. Cl.⁶ .......................... H03K 17/16; H03K 5/08
[52] U.S. Cl. .................... 327/317; 327/312; 327/379; 361/18; 361/90; 361/111; 326/27
[58] Field of Search ................................ 327/310, 312, 327/317, 379, 380, 381, 382, 551, 134, 170, 21, 26, 27, 362, 111; 326/21, 25, 26, 27; 361/111, 90, 58, 18

[56] References Cited

U.S. PATENT DOCUMENTS

| | | | |
|---|---|---|---|
| 4,268,785 | 5/1981 | Svendsen | 327/311 |
| 4,857,863 | 8/1989 | Ganger et al. | 330/264 |
| 4,864,249 | 9/1989 | Reiffin | 330/263 |
| 4,992,755 | 2/1991 | Seevinck et al. | 330/253 |
| 5,343,164 | 8/1994 | Holmdahl | 330/253 |
| 5,414,382 | 5/1995 | Larson et al. | 327/561 |

*Primary Examiner*—Timothy P. Callahan
*Assistant Examiner*—Terry L. Englund
*Attorney, Agent, or Firm*—Blakely, Sokoloff, Taylor & Zafman LLP

[57] ABSTRACT

A voltage overshoot limiter having a detector circuit that looks at the node at which the undesirable overshoot would occur and provides a signal that is proportional to the unipolar rate of change of voltage at the node. This output is fed back to the first stage of the control circuit, error amplifier, etc. in such a manner as to reduce the rate of change of the circuit's nodal voltages to less than their slewing rates. By modifying the value of the detector's output for a given detected slew rate at the node, it is possible to reduce both its overshoot significantly and to reduce its unipolar rate of voltage change. The invention is described as being unipolar, that is, responding to rates of change of voltages which are either positive or negative, though bipolar implementations may be realized.

19 Claims, 10 Drawing Sheets

VOLTAGE OVERSHOOT LIMITER

BACKGROUND OF THE INVENTION

1. Field of the Invention

The present invention relates to the field of power supplies and other electronic circuits wherein overshoots from transient conditions causing slewing of one or more circuit nodes need to be controlled.

2. Background of the Invention

In many power supply circuits, it is desirable to limit output voltage overshoot, at startup or under various transient conditions, to very low values that might typically be say less than about 2%. This often places severe restrictions on the design of their control circuits with regard to the AC performance of the embedded error amplifiers and the associated feedback loops. In order to achieve very low values of output voltage overshoot, the conventional approach is to use more current (translates into more power) in the biasing of the error amplifiers and to restrict the range of output loads (usually a combination of dissipative elements and capacitors). It should be noted that under normal operating conditions the error amplifier is assumed to be functioning in a linear mode and, of course, must be stable. However, there is a second mode whereby for large transient conditions (for example load changes, input supply voltage changes, etc.), the error amplifier may be required to slew part or all of its circuitry to respond to the transient. During slewing the error amplifier does not operate in a linear manner whereby its output is simply defined by its small signal, low frequency characteristics and feedback loop(s). Instead, the rate of change of voltage at the output, and maybe also at one or more nodes within the error amplifier, will be limited by the available values of the drive current and the associated component and parasitic capacitances at these nodes. Consequently, large operating transients are not responded to well by the control circuitry, and overshoots can occur because of the finite time that the control circuit takes to recover from a slew mode to a linear mode of operation. The invention describes a technique to limit voltage overshoot without compromising the control circuitry nor requiring the use of high biasing currents, output load restrictions, etc. Also, to the first approximation, the technique of the present invention does not affect the control circuit loop stabilities or small signal response of the circuitry.

Also most analog systems including amplifiers, signal conditioners etc. have high frequency limitations. One limitation occurs when an input signal has a rate of change of voltage greater than a specific value above which the rate of change of the output signal does not further increase. Under these conditions the system is said to be slewing—a further increase of rate of change of input voltage is not reflected at the output as a further increase of rate of change of output voltage. The reason for slewing is due the finite values of capacitance (both component and parasitic) at each circuit node and the finite available nodal drive currents. The available nodal drive current divided by the finite value of capacitance of the node defines a maximum nodal rate of change of voltage or nodal slew rate. When a system, having one or more signal path nodes (there must be at least one node—the output node) slews, it is caused by the limitation of the maximum rate of change of voltage of the slowest node.

However, if the system is operating in a low frequency linear mode, each node assumes voltage values primarily dependent upon the system transfer characteristics, the input driver parameters and the output load parameters. Nodal voltages do not depend, to the first order, on nodal capacitances nor nodal drive currents. Consequently, many analog systems may be made to operate in two very different modes—linear and slewing.

An ideal system will respond to a transient (output load change, power supply glitch, etc.) in a benign way; namely, without overshooting. In the real world, compromises are made to minimize overshooting that can be undesirable. These may include higher nodal current drives, restrictions on output loads, reduced system gains (often resulting in lower system accuracies), and so on. Voltage overshoots are often the consequence of differential nodal slewing whereby the effective slew rate of certain node(s) are faster than other nodes. Consider the example shown in FIG. 1a which depicts a simple operational amplifier operating in a unity gain mode having a differential input stage with an output at node VA. This output drives a single ended gain stage with a load ZL. (Both the differential input stage and the single ended gain stage are inverting stages in this example.) It is assumed that the circuit as shown is small signal stable having internal frequency compensation (this will be described later) and that node VA can slew faster than the output node can with its applied load ZL. FIG. 1b shows the response of node VA and the output node to a moderate amplitude square wave input signal. Note that the voltage at node VA rapidly slews to its maximum deviation value well before the output signal has reached its desired output level. When the output signal reaches its desired output level the voltage at node VA has to slew back to the DC level necessary to control the output voltage level to its desired level. However this takes a finite time and so for that time the second stage has an excess drive on its input and consequently the output overshoots. In the example, for simplicity, the overshoot is shown damped and returning after the overshoot to its correct voltage level. More often in practice the overshoot, instead of being critically damped, will exhibit a damped ringing response shown by the dotted curves in FIG. 1b.

BRIEF SUMMARY OF THE INVENTION

The present invention consists of a detector circuit that looks at the node at which the undesirable overshoot would occur and provides an output current that is proportional to the unipolar rate of change of voltage at the node. This output current is fed back to the first stage of the control circuit, error amplifier, etc. in such a manner as to reduce the rate of change of the circuit's nodal voltages to less than their slewing rates. In so doing by modifying the value of the detector's output current for a given detected slew rate at the node, it is possible to reduce both its overshoot significantly and to reduce its unipolar rate of voltage change. Correct proportioning of the elements of the invention will therefore not affect the system's operation at DC or low frequencies. The invention will have maximum effect when transients would otherwise force the system into slewing.

The invention is described as being unipolar, that is, responding to rates of change of voltages which are either positive or negative. However, using two of these inventions having opposite characteristics would permit bipolar overshoot control (symmetrical or unsymmetrical as appropriate). Alternatively, economies in component count can usually be had in combining two detectors into a single circuit.

The object of the invention is to modify the slew characteristics of a system by slowing down the rate of change of voltage at all internal signal path nodes including the output node so that output voltage overshoot can be reduced or even eliminated. In most practical applications it is desirable to reduce overshoot to a small value rather than to eliminate overshoot altogether. The reason for this is that there is a tradeoff between overshoot reduction and an increase in output response time which, in many applications, is undesirable.

BRIEF DESCRIPTION OF THE DRAWINGS

These and other features of the invention will now be described with reference to the drawings of a preferred embodiment which is intended to illustrate and not to limit the invention, and in which:

FIG. 3 is a circuit diagram of the unity gain configuration of the operational amplifier of FIG. 1a.

DETAILED DESCRIPTION OF THE INVENTION

The present invention consists of a detector that detects a unipolar rate of change of voltage and for large changes and large rates of change, produces an output current proportional to that rate of change of voltage. In the preferred embodiment, this output current is fed back into the system to be controlled in such a manner as to reduce the slew rate of the first node in the signal path after the input node.

Figure 2:
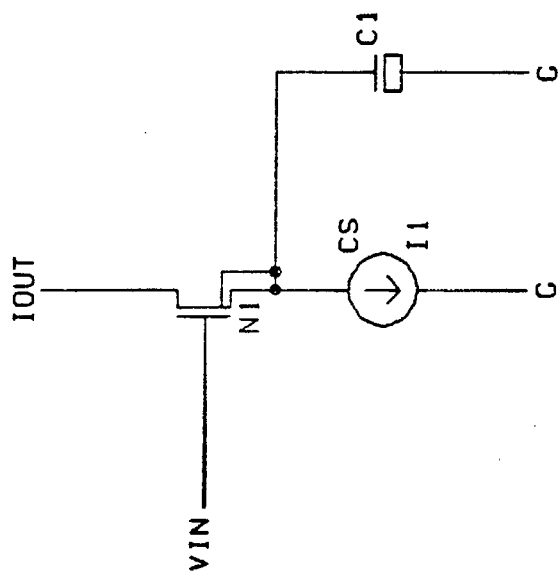
FIG. 2 shows a simple implementation of the overshoot compensation of the present invention.

FIG. 2 shows a simple implementation of the invention consisting of a low value current source CS, a capacitor C1 and a sense transistor N1. The output current IOUT of this detector is I1 under steady state conditions, and under slew conditions is equal to the product of the value of the capacitor C1 and the positive rate of change of voltage—positive slew rate—of VIN, plus current I1. During slewing conditions, by a suitable choice of component values, the effect of I1 is small enough as to be ignored. This output current is applied usually to a suitable node in the input stage of the control circuit (error amplifier etc.). This current is used to oppose the normal drive currents, thereby reducing the nodal slew rates in the signal path. Another way to view this is to consider the invention as applying negative feedback during output slewing of the system. As soon as the system achieves its desired output level the feedback current reduces to I1 which is so small in magnitude as to cause minimal effect.

Figure 1A:
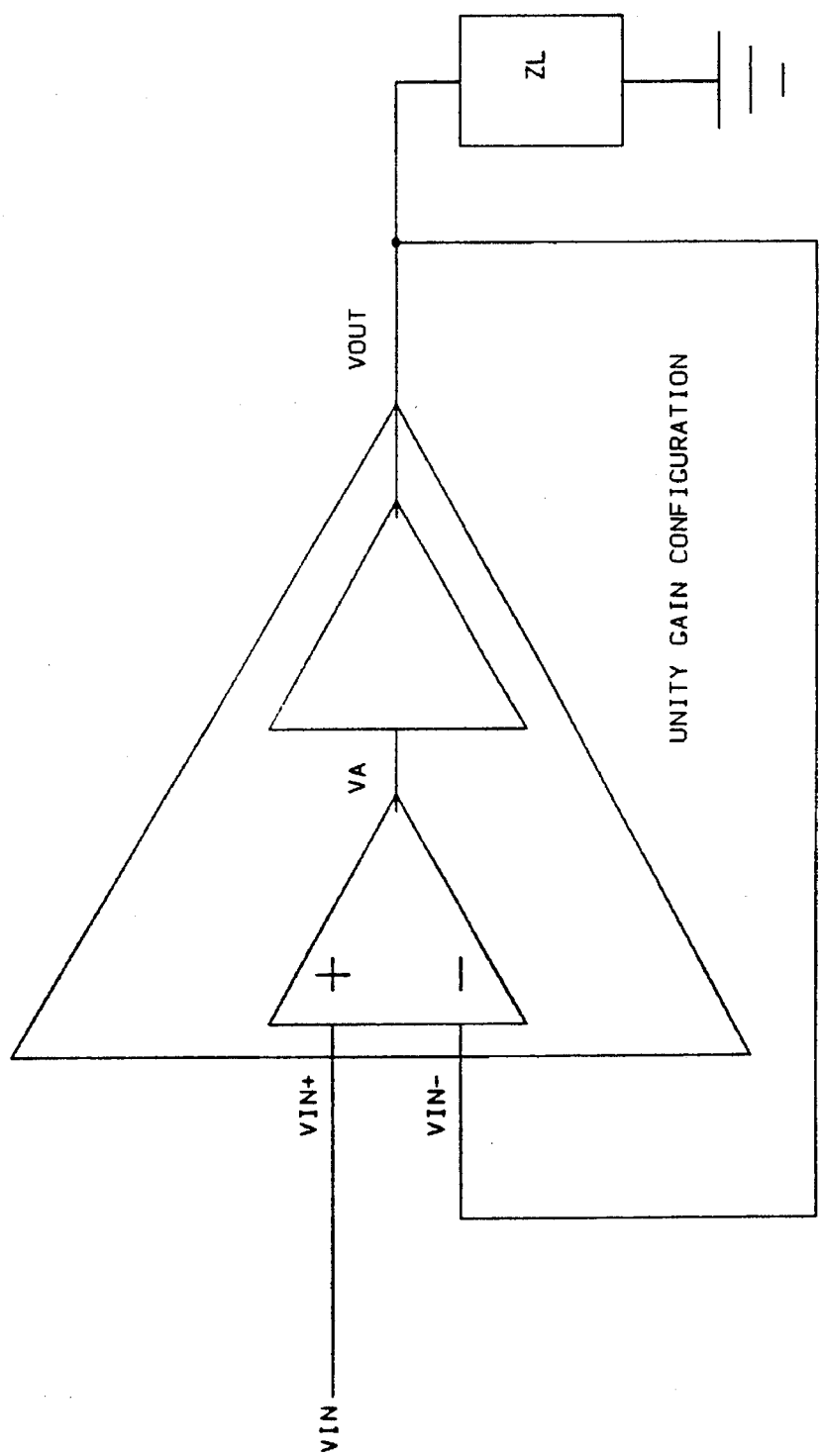
FIG. 1a is a diagram of a simple operational amplifier operating in a unity gain mode.
Figure 1B:
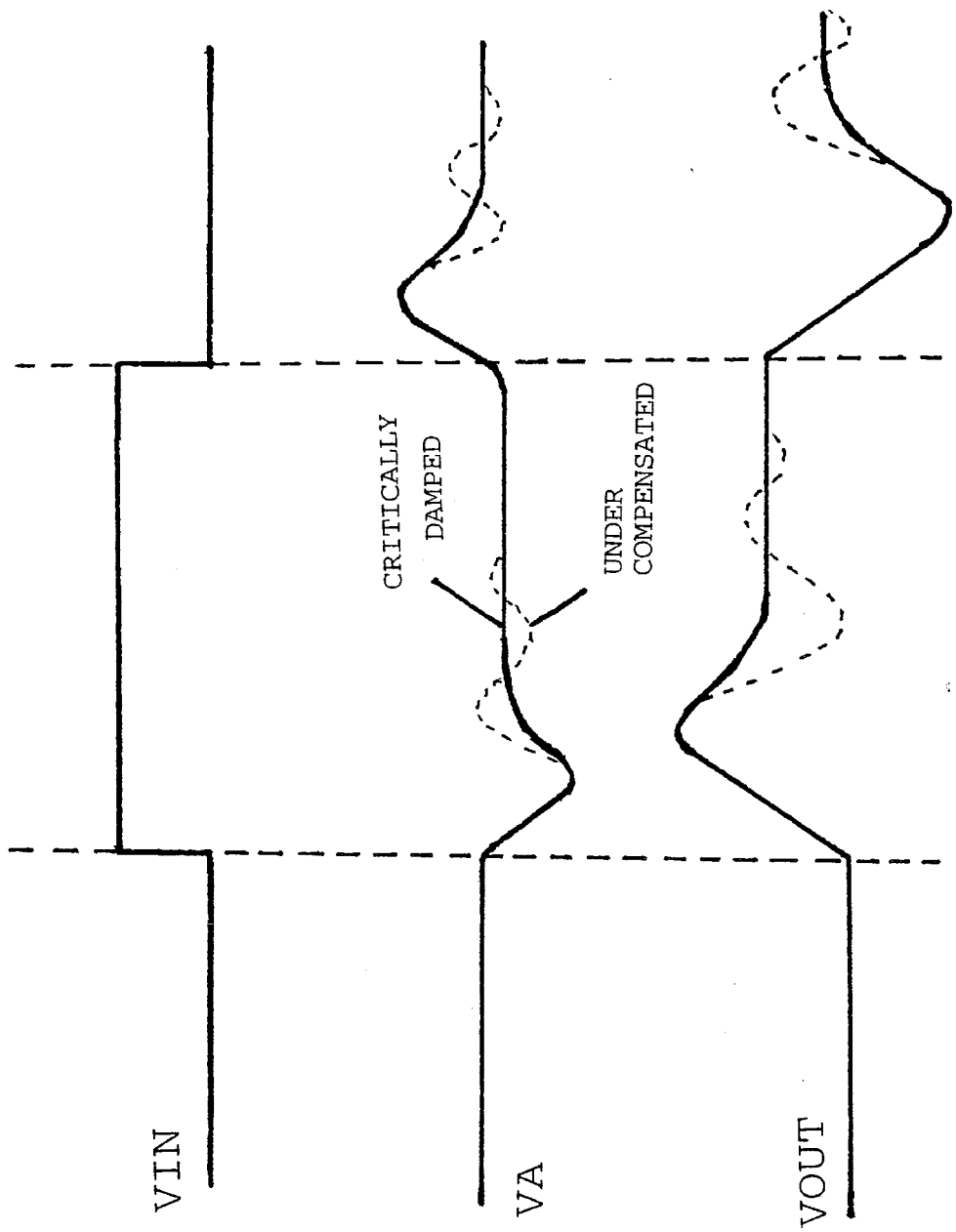
FIG. 1b shows the response of node VA and the output node of the amplifier of FIG. 1a to a moderate amplitude square wave input signal.
Figure 3:
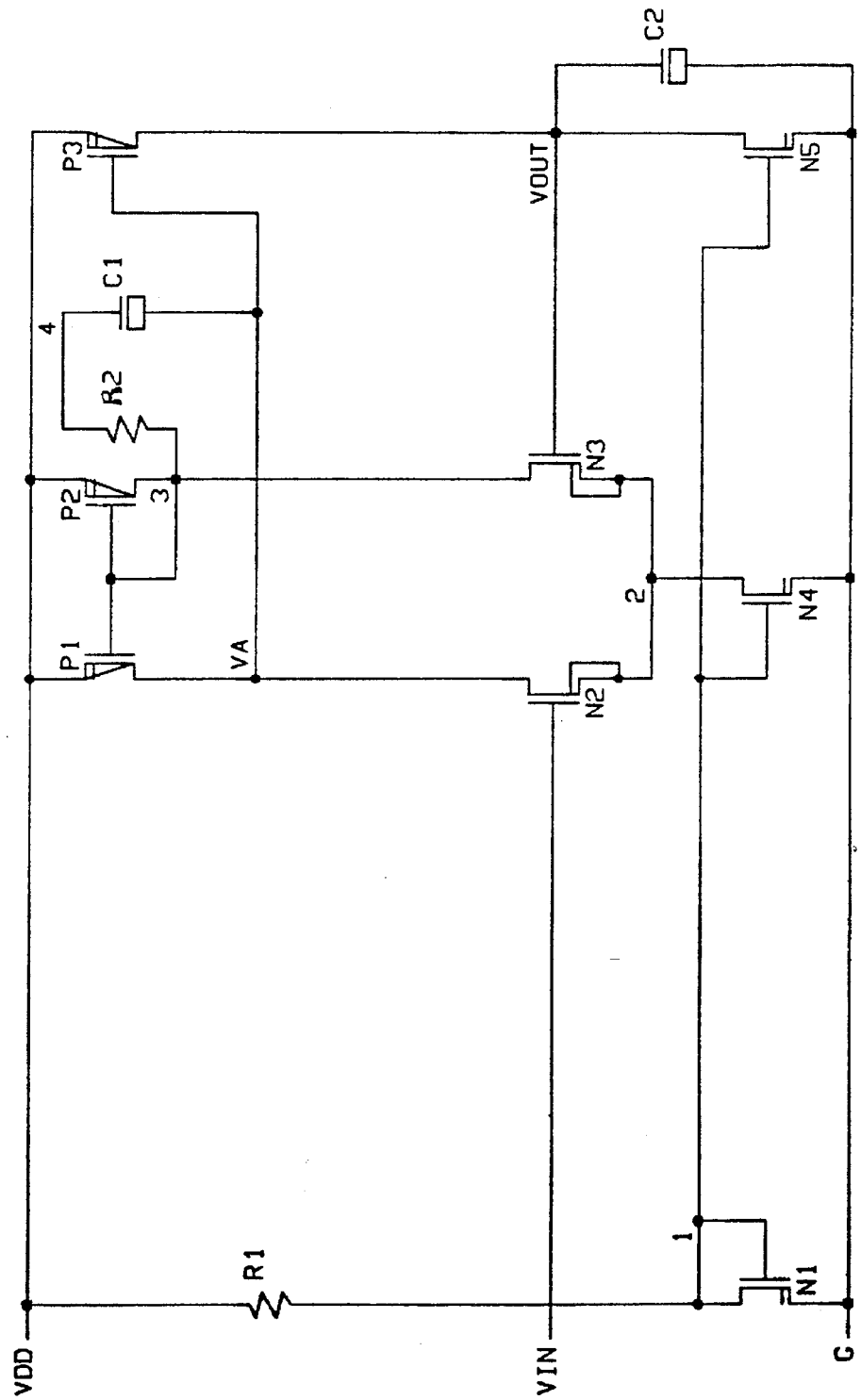

FIG. 3 shows the schematic of the unity gain configuration of the operational amplifier of FIG. 1a in detail, including the bias scheme of transistor N1 and resistor R1, and the internal frequency compensation of capacitor C1 and resistor R2. For this example a unity gain configuration is chosen for simplicity; there being no requirement for a feedback resistor network. Also the choice of a capacitive load of 200 pF represents a difficult load and the type that a power supply might be expected to drive under certain conditions.

In the circuit of FIG. 3, resistor R1 sets the current through transistor N1 to be (VDD−Vthres$_{N1}$)/R1, where Vthres$_{N1}$ is the threshold voltage of transistor N1. This current is mirrored to transistors N4 and N5, in the specific example given, so that the current in each of transistors N4 and N5 is twice the current in transistor N1 due to the particular sizing of these transistors N4 and N5 (100W, 16L) with respect to transistor N1 (50W, 16L) where "W" and "L" designate the width and length of the transistors channels. The current of transistor N4 divides between transistors N2 and N3 in accordance with the relative voltages on the gates thereof, specifically the difference between the input voltage VIN and the output voltage VOUT of the circuit. The current in transistor N3 is mirrored to transistor P1 by transistor P2, so that the current charging node VA is the difference between the current in transistor N3 and the current in transistor N2, which in turn is dependent on the differential input voltage to the gates of these transistors, node VA discharging if VIN>VOUT and charging if VIN<VOUT. Node VA is coupled to the gate of transistor P3 which together with the transistor N5, forms the output stage, transistor P3 forming the pull up device for the output voltage VOUT, and the current in transistor N5 providing a pull down current for limited current sinking, if required, when transistor P3 is off.

The internal frequency compensation of capacitor C1 and resistor R2 is used to ensure that the system is stable in its linear mode of operation from unity gain through open loop gain configurations. The addition of C1 and R2 modifies the open loop gain and excess phase so that with the 200 pF load shown, the gain is never greater than unity for an excess phase shift of 180 degrees.

The unity gain step response of this amplifier is shown in FIG. 4. Note the large overshoots at startup and for positive input steps. The ringing is due to the fact that the amplifier is under compensated with the capacitive output load. This degree of ringing is often seen with operational amplifiers having capacitive loads and represents a fairly typical mode of operation.

Figure 5:
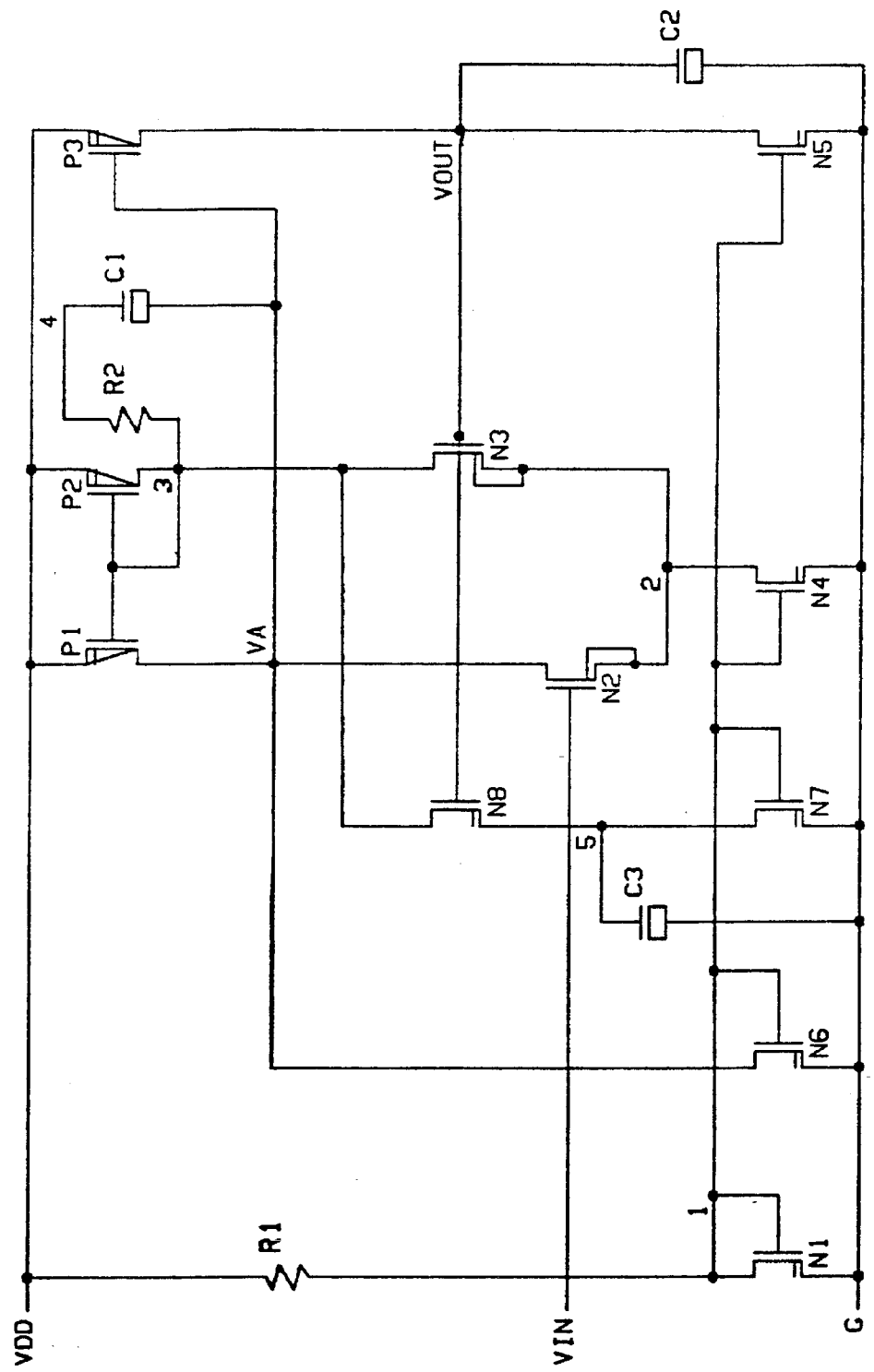
FIG. 5 is a circuit diagram of the unity gain configuration of the operational amplifier of FIG. 3 further including the overshoot compensation of the present invention.

An identical system as that shown in FIG. 3 is shown in FIG. 5 except that it contains the overshoot compensation circuit. Accordingly devices given the same numeral identifications in FIG. 5 as in FIG. 3 function the same as described with respect to FIG. 3. The current source of the invention is produced by transistor N7 mirroring a fraction of the current in transistor N1, and the current output of the invention is fed into node 3. The steady state value of this current is approximately one eleventh of the current flowing in transistor P2. To compensate for this extra current in one leg of the differential input stage, transistor N6 supplies an equal additional current in transistor P1, thereby effectively balancing the currents in transistors P1 and P2. Thus under DC or low frequency conditions, the effect of the overshoot compensator is negligible on the performance of the basic amplifier. In the steady state, the voltage of node 5 will settle at VOUT—Vthres$_{N8}$ where Vthres$_{N8}$ is the threshold voltage of transistor N8.

If the output node VOUT moves rapidly in the positive direction, as would occur with a rapid decrease in the voltage node VA, the drain current of transistor N8 assumes a value equal to the current source transistor N7 plus another component proportional to the product of the value of C3 and the rate of change of voltage at VOUT. This excess current into transistor P2 is mirrored by transistor P1 to increase the current into node VA to reduce the negative rate of change of voltage on node VA. For a rapid decrease in the output voltage VOUT, capacitor C3 temporarily holds the voltage of node 5 and thus the source voltage of transistor N8, so that the reduced voltage on the gate of transistor N8 tends to turn transistor N8 off to decouple the overshoot compensation circuit from the rest of the circuit until the voltage on capacitor C3 decreases through current flow through transistor N7 and/or the output voltage VOUT returns to its prior value. Thus this feedback, occurring only with large positive rates of change of voltage at VOUT, effectively modifies and reduces the intrinsic maximum slew rates of the amplifier and accordingly reduces the propensity for the output to overshoot. Note that the degree of correction, or the percentage reduction of the overshoot, is dependent on the component values, particularly the value of C3.

Figure 4A:
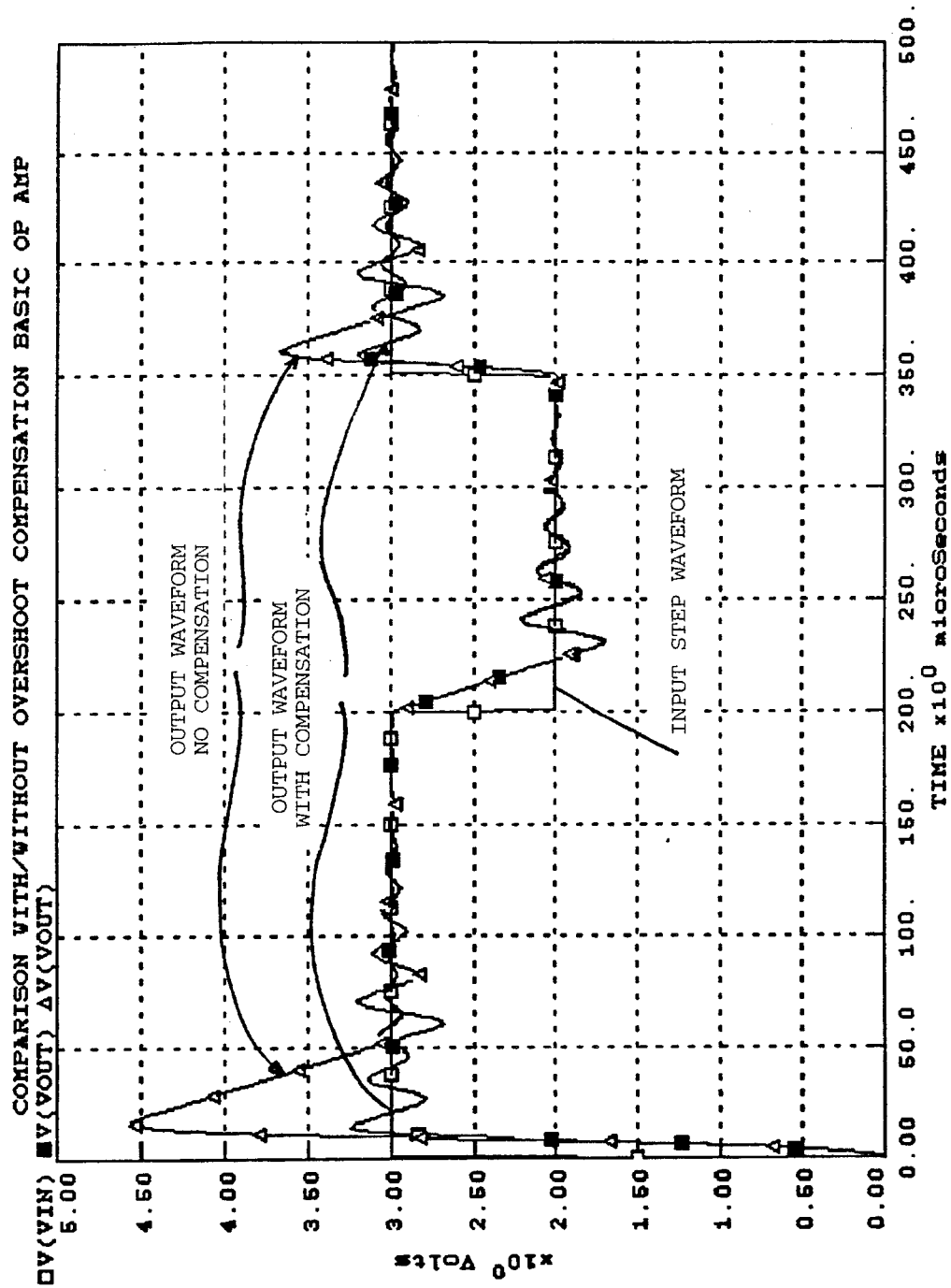
FIG. 4a is a waveform diagram illustrating the typical response of the circuit of FIG. 3 without overshoot compensation and the circuit of FIG. 5 having overshoot compensation to a start-up transient and a temporary negative input step.
Figure 4B:
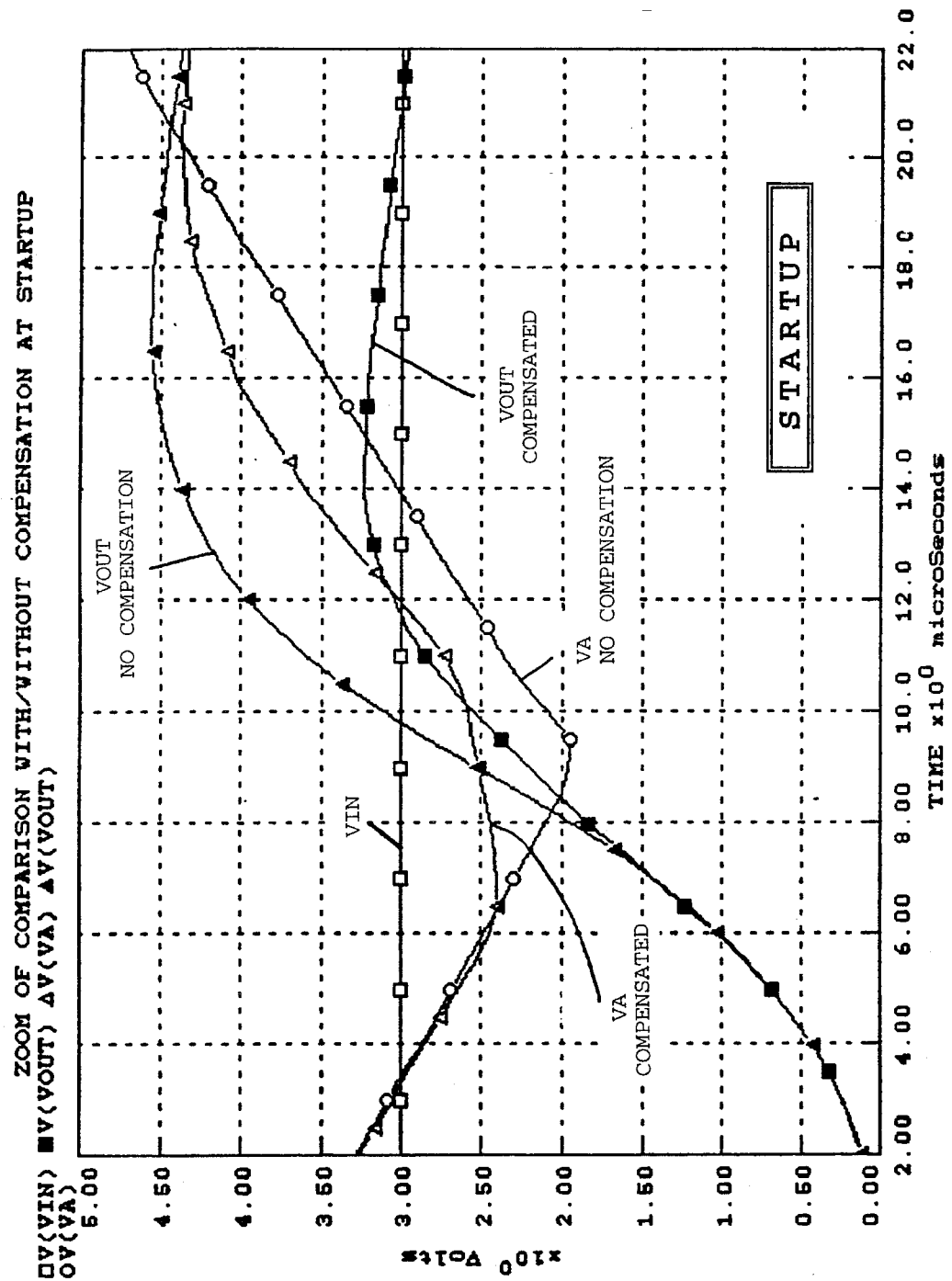
FIG. 4b is a waveform diagram illustrating on an expanded scale the typical response on start-up of the circuit of FIG. 3 without overshoot compensation and the circuit of FIG. 5 having overshoot compensation.
Figure 4C:
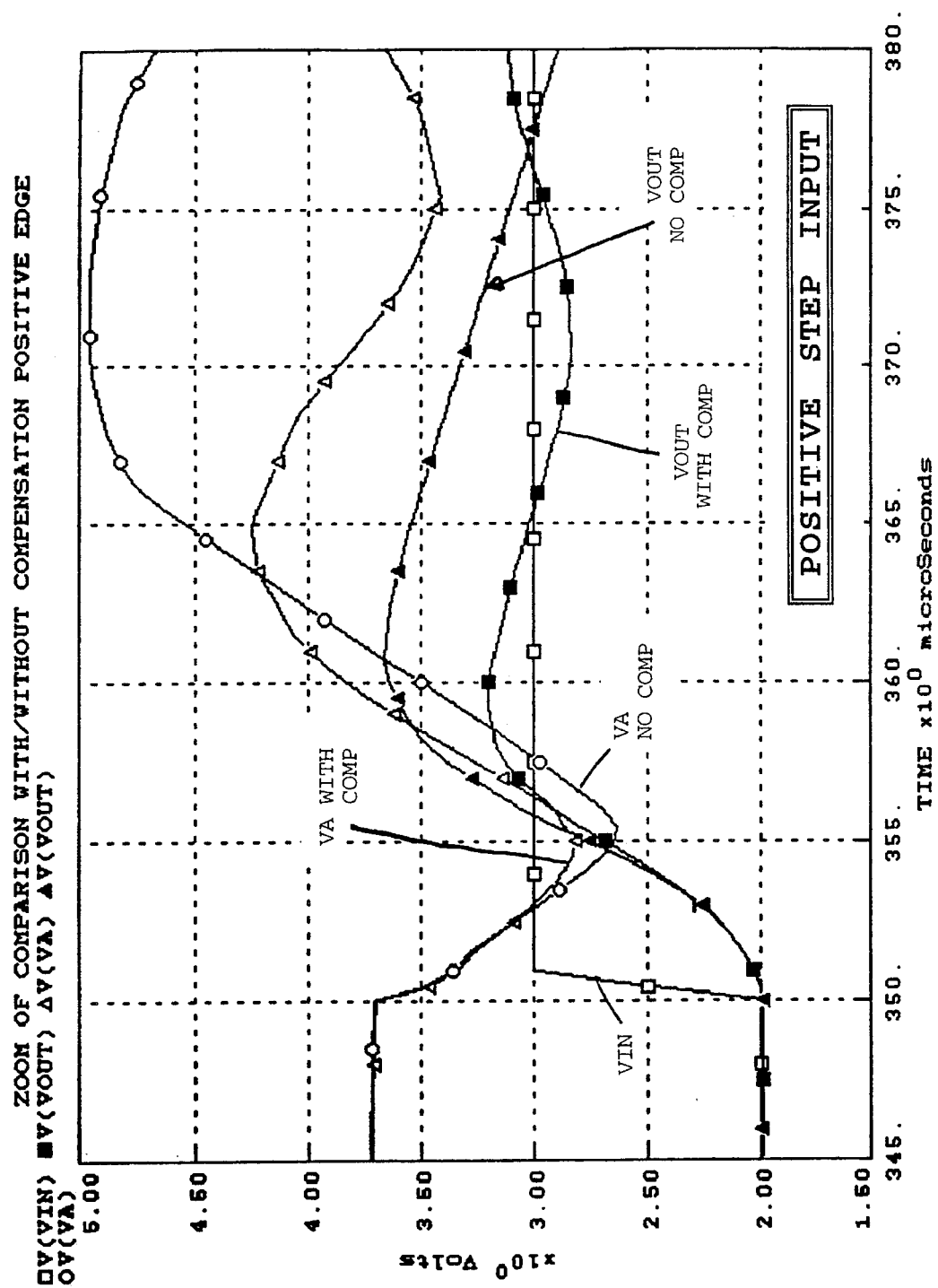
FIG. 4c is a waveform diagram also on an expanded scale illustrating the typical response, of the circuit of FIG. 3 without overshoot compensation and the circuit of FIG. 5 having overshoot compensation, to a positive step in input voltage from one operating condition to a second higher input voltage input condition.

Referring back to FIG. 4a, the reduction of positive overshoot due to the invention can be seen. Note that the negative step response is unchanged. FIGS. 4b and 4e show responses of both the overshoot uncompensated and the overshoot compensated amplifiers with more nodes plotted together with zoom plots of the positive steps for greater clarity.

In FIG. 4b, the curve for VOUT with no overshoot compensation has a general shape not unlike what one might expect to see for the transient response of a linear system. It is to be noted, however, that the curve for the voltage of node VA for no overshoot compensation is in general quite different, and unlike what one would expect for a linear system. In particular the curve for the voltage of node VA with no overshoot compensation begins at approximately 3.3 volts and declines at a constant rate, characteristic of slewing limitations, as opposed to a linear system response. Similarly, once the minimum for the voltage of node VA is reached, the voltage of node VA with no overshoot compensation increases substantially linearly, again characteristic of slewing and not of a linear system response.

Figure 4D:
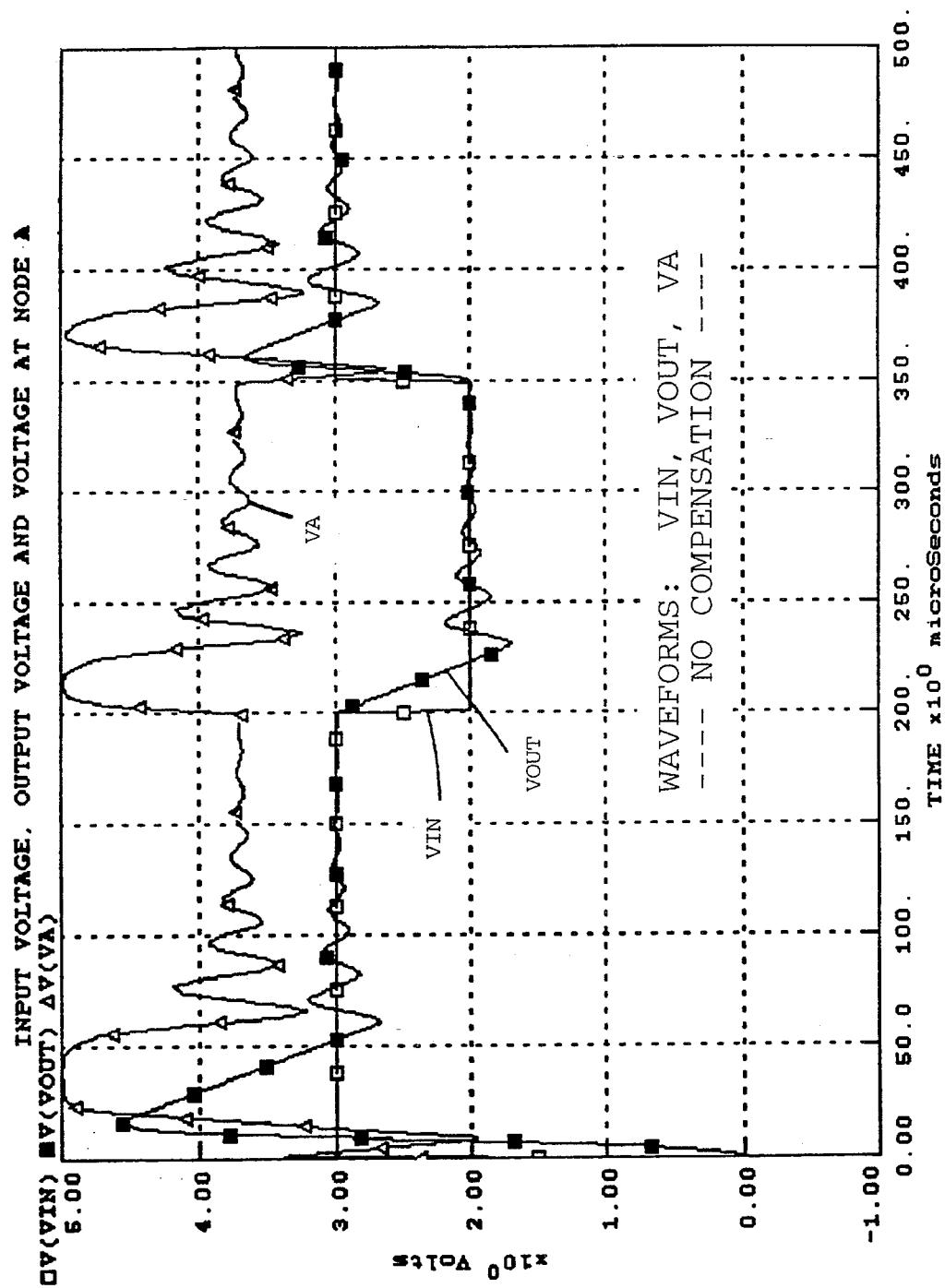
FIG. 4d is a waveform diagram illustrating the typical response of the circuit of FIG. 3, without overshoot compensation, to a start-up transient and a temporary negative input step during operation.
Figure 4E:
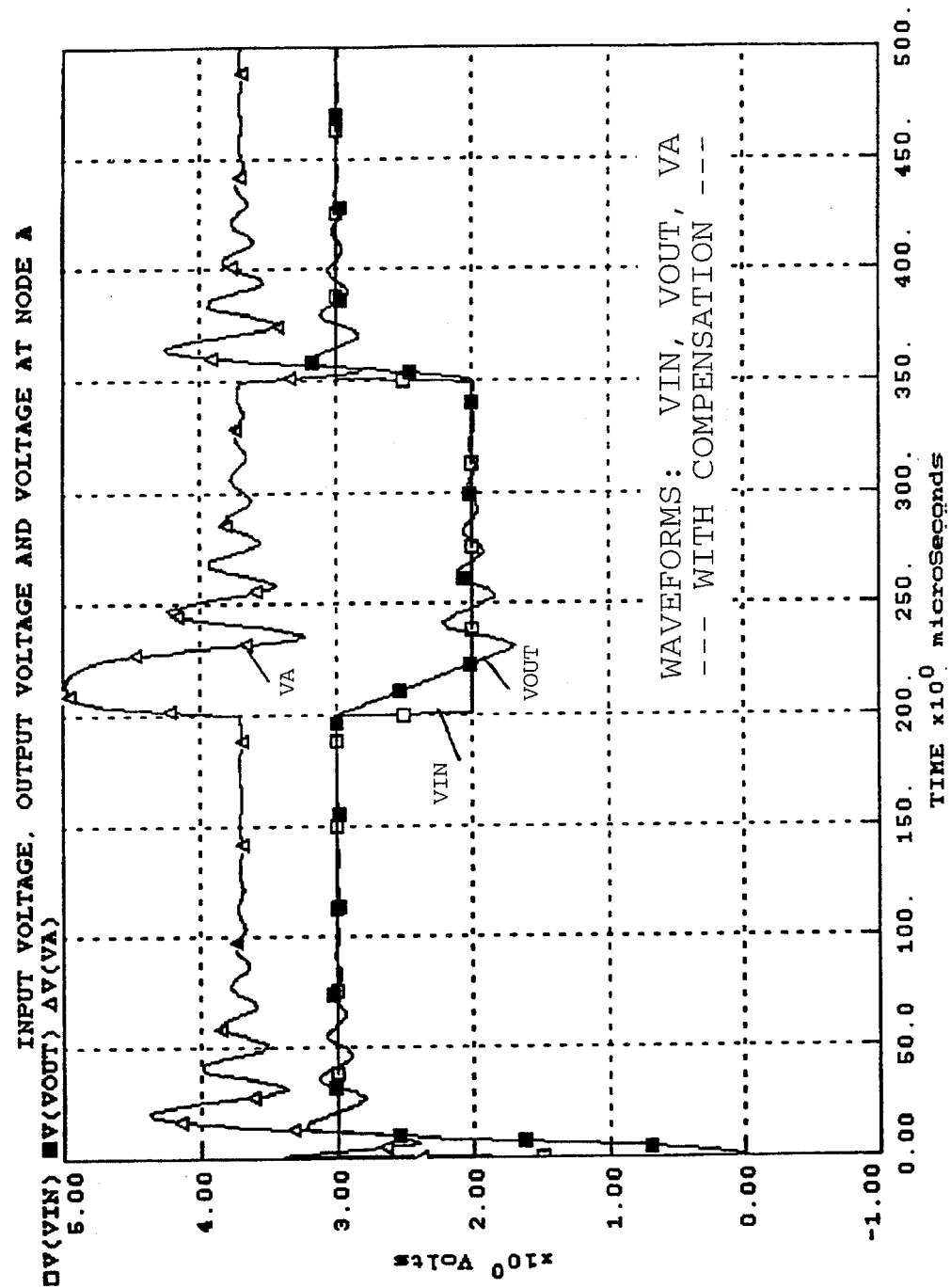
FIG. 4e is a waveform diagram illustrating the typical response of the circuit of FIG. 3, with overshoot compensation, to a start-up transient and a temporary negative input step during operation.

One consequence of this slewing can be seen by noting from FIG. 4d that the steady state voltage for node VA to hold the output VOUT equal to the input VIN of 3 volts is approximately 3.7 volts. However, as may be seen in FIG. 4b, when the voltage VOUT with no overshoot compensation initially reaches what should be the steady state voltage VIN of 3 volts, the voltage of node VA is only slightly more than 2 volts, and is limited in its rate of increase, not by the difference between VOUT and VIN, but by the lower slewing rate of the node, allowing the very substantial initial overshoot in the output waveform for the voltage VOUT as illustrated in FIGS. 4a and 4d.

The overshoot compensation circuit of the present invention, however, substantially alters the response to a positive going transient, as may be seen in FIGS. 4a, 4b, 4c and 4e. In particular, note that the initial response in the voltage of node VA and in the output voltage VOUT is substantially the same with overshoot compensation as without. However, as the rate and extent of change of the voltage VOUT increases, the slewing of the voltage of node VA in a negative direction is halted by the overshoot compensation of the present invention, and the direction of change of the voltage of node VA even reversed, so that by the time the output voltage VOUT with overshoot compensation first reaches the input voltage VIN of 3 volts, the voltage of node VA has been encouraged by the overshoot compensation circuit back to approximately 3 volts itself, from which it raises in a manner much more characteristic of a linear system to pass through what ultimately would be the steady state voltage of 3.70 volts for node VA before the output voltage VOUT overshoots its ultimate steady state voltage of 3 volts by very much. Thus, as may be seen in the left most part of FIG. 4b (see also FIG. 4c), the overshoot compensation of the present has negligible effect on the controlled node (VA in the exemplary embodiment) when the rate of change of voltage on the controlling node (VOUT in the exemplary embodiment) is not changing too rapidly, but has a substantial effect in controlling or even overcoming slewing when the rate of change of voltage on the controlling node is approaching the limit for an acceptable overshoot of the circuit in question.

Thus a simple scheme has been shown to reduce unipolar overshoot without affecting linear operation or stability. This scheme modifies the performance of the system when slewing or when very close to slewing. The particular example disclosed herein has been described to correct for positive overshoot correction. However, the scheme is equally applicable for negative overshoot correction (this can easily be seen by reversing the polarities of the power supplies and exchanging all p-channel transistors with n-channel transistors and n-channel transistors with p-channel transistors). A further extension would be to combine both a positive and a negative detector together to form a bipolar overshoot detector.

In any case, the invention is easily implemented entirely in CMOS or other integrated circuit form as part of integrated circuit amplifiers, power supplies and the like because of its low component count, low required additional integrated circuit area and component compatibility with integrated circuit fabrication techniques, resulting in a low cost solution to overshoot problems from slewing within a circuit without significantly effecting the linear characteristics of the system. However it should be noted that the relatively soft or gradual turn-on characteristics of CMOS devices is a desirable characteristic for the present invention. In particular, referring to FIG. 5 again, it was previously stated that in a preferred embodiment, the steady state value of the current through transistors N7 and N8 is approximately one eleventh of the current flowing in transistor P2. Thus transistor N8 is barely conducting. Consequently small variations in VOUT, which is also the gate voltage of transistor N8, do not change the conduction of the transistor or the current through transistor N8 very much, no matter how fast the small variations in VOUT, so that the capacitor C3 is essentially decoupled from the circuit for small signal perturbations, or at least coupled in circuit through the then high resistance of the transistor. Thus the transient response of the circuit to small disturbances is substantially unchanged by the presence of capacitor C3 and transistors N7 and N8, even though capacitor C3 has a major effect in limiting or preventing slewing and controlling the overshoots caused thereby on the occurrence of large disturbances. Similarly the capacitor has little effect on the DC and low frequency response of the circuit. For CMOS circuits, the transient response of disturbances of perhaps 100 mv to as high as 300 mv are substantially unaffected by the overshoot limiting circuit of the present invention, but for rapid disturbances on the order of a volt or more in the proper direction, the transistor will be turned on fairly hard to directly couple the capacitor to the desired circuit node.

If the same circuit is realized using junction transistors, the sharper turn-on characteristics of such transistors would perhaps unnecessarily limit the disturbances for which the overshoot limiting circuit did not effect the transient response. Accordingly in such instances, it may be desirable to soften the turn-on characteristics of the transistor functioning as transistor N8 of FIG. 5, such as by way of example, by the inclusion of a resistor in the emitter circuit thereof.

While the present invention has been disclosed and described with respect to a certain preferred embodiments thereof, it will be understood to those skilled in the art that the present invention may be varied without departing from the spirit and scope of the invention. The described embodiments are to be considered in all respects to be illustrative and not restrictive. The scope of the invention is, therefore, indicated by the appended claims rather than the foregoing description. All changes which come within the meaning and range of equivalency are to be embraced within their scope.

What is claimed is:

1. A circuit comprising:
   an output circuit having an output node;
   a first circuit portion with a first node having a voltage subject to slewing; and
   an overshoot compensation circuit coupled between the output circuit and the first circuit portion, said overshoot compensation circuit is responsive to a change in voltage at the output node greater than a predetermined change and a rate of change in the voltage at the output node greater than a predetermined rate to limit the slewing of the voltage at the first node without substantially effecting the DC and low frequency response of the circuit.

2. The circuit of claim 1 wherein the overshoot compensation circuit is a unipolar circuit responsive to (i) at least the predetermined change in and (ii) the rate of change of at least the predetermined rate in the voltage at the output node in one direction to limit the slewing of the voltage at the first node.

3. The circuit of claim 1 wherein the overshoot compensation circuit is a unipolar circuit responsive to (i) the change of at least the predetermined change in and (ii) the rate of change of at least the predetermined rate in the voltage at the output node in a positive direction to limit the slewing of the voltage at the first node.

4. The circuit of claim 1 wherein the overshoot compensation circuit is a unipolar circuit responsive to (i) the change of at least the predetermined change in and (ii) the rate of change of at least the predetermined rate in the voltage at the output node in one direction by feeding back an overshoot compensating current to a current summing point in the first circuit portion in order to limit the slewing of the voltage at the first node.

5. A circuit comprising:
   a differential input stage with first and second inputs and a first node having a voltage determined by a net current into the first node;
   an output circuit having an output node responsive to the voltage of the first node; and
   an overshoot compensation circuit coupled between the output circuit and the differential input stage and responsive to at least a change in a voltage at the output node greater than a predetermined change and a rate of change greater than a predetermined rate in the voltage at the output node to feed back a current to the differential input stage in order to limit the magnitude of the net current of the first node thereby limiting slewing of the voltage at the first node without substantially effecting the DC and low frequency response of the circuit.

6. The circuit of claim 5 wherein the overshoot compensation circuit comprises:
   a capacitor;
   a current source being coupled across the capacitor; and
   a transistor being coupled to the output node, the capacitor and the differential input stage.

7. The circuit of claim 5 or claim 6 wherein the circuit is in an integrated circuit form.

8. The circuit of claim 7 wherein the circuit is in a CMOS integrated circuit form.

9. An integrated circuit comprising:
   a first current source;
   a differential input stage including first and second inputs controlling first and second transistors which are coupled to said first current source so that the current of said first current source equals the sum of the currents in the first and second transistors, the first and second transistors being coupled to first and second nodes respectively which are coupled to first and second current mirroring transistors respectively to mirror the current through the second current mirror transistor to the first current mirror transistor;
   an output circuit having an output node responsive to a voltage of the first node; and,
   an overshoot compensation circuit coupled between the output circuit and the second node of the differential input stage, said overshoot compensation circuit being responsive to (i) a predetermined change in a voltage applied to the output node and (ii) a predetermined rate of change applied to the voltage of the output node to feed back a current to the second node in order to limit the magnitude of a net current into the first node thereby limiting slewing of the voltage at the first node.

10. The circuit of claim 9 wherein the overshoot compensation circuit comprises a capacitor, a second current source and a third transistor, the second current source being coupled across the capacitor, and the third transistor being coupled to the output node, the capacitor and the second node.

11. The circuit of claim 9 or claim 10 wherein the circuit is in an integrated circuit form.

12. The circuit of claim 11 wherein the circuit is in a CMOS integrated circuit form.

13. A method of controlling slewing of a voltage at a node in an integrated circuit caused by changes in circuit operating conditions, the method comprising the steps of:

providing a capacitor in the integrated circuit to track a circuit parameter without substantially effecting the DC and low frequency response of the integrated circuit; and coupling the capacitor to decrease a current drive, said current drive causing slewing responsive to the circuit parameter upon experiencing a change in the circuit operating conditions greater than a predetermined change and a rate of change in the circuit operating conditions greater than a predetermined rate.

14. A method of controlling slewing of a voltage of a node in an integrated circuit based on changes in circuit operating conditions, the method comprising the steps of:

providing a capacitor, a transistor and a current source as part of the integrated circuit, wherein said transistor has a turn-on characteristic controlled by a voltage in the circuit which is responsive to the voltage of the node, the turn-on characteristic is gradual over time;

coupling the capacitor and the current source in parallel; and coupling the transistor with the current source and capacitor so that the capacitor injects a current to reduce slewing of the voltage of the node when the transistor is turned on, said slewing of the voltage of the node is caused by a change in the voltage controlling the turn-on characteristic of the node being greater than a predetermined change and a rate of change in the voltage controlling the turn-on characteristic of the node being greater than a predetermined rate.

15. A method of controlling overshoot of an output voltage of an integrated circuit resulting from slewing of a voltage of a first node caused by changes in circuit operating conditions, the method comprising the steps of:

providing a capacitor, a transistor and a current source as part of the integrated circuit, wherein said transistor has a turn-on characteristic controlled by the output voltage of the integrated circuit, the turn-on characteristic is gradual over time;

coupling the capacitor and the current source in parallel; and coupling the transistor with the current source and capacitor so that the current source and capacitor are coupled to a second node in order to provide a node current responsive to the current source to maintain the transistor slightly conducting under steady state operating conditions, and to inject a current to reduce slewing of the voltage of the first node when the transistor is turned on upon changes in the output voltage greater than a predetermined change and rates of change in the output voltage greater than a predetermined rate.

16. A circuit comprising:

an output circuit having an output node;

a first circuit portion with a first node having a voltage subject to slewing upon the output node experiencing a change in voltage; and an overshoot compensation circuit coupled between the output circuit and the first circuit portion, said overshoot compensation circuit is responsive to at least a change greater than a predetermined change in the voltage at the output node and a rate of change greater than a predetermined rate in the voltage at the output node which limits slewing of the voltage at the first node without substantially effecting the DC and low frequency response of the circuit by feeding back an overshoot compensating current to a current summing point in the first circuit portion in order to limit the slewing of the voltage at the first node.

17. The circuit according to claim 16, wherein said overshoot compensating circuit is a unipolar circuit that feeds back said overshoot compensating current to said current summing point when said voltage at the output node in one direction is experiencing the change greater than the predetermined change and the rate of change greater than the predetermined rate.

18. A circuit comprising:

a differential input stage with first and second inputs and a first node having a voltage determined by a net current into the first node;

an output circuit having an output node responsive to the voltage of the first node; and an overshoot compensation circuit responsive to at least a predetermined change in a voltage at the output node and a rate of change in the voltage at the output node by feeding back a current to the differential input stage in order to limit a magnitude of the net current of the first node in order to limit slewing of the first node without substantially effecting the direct current and low frequency response of the circuit, said overshoot compensation circuit including
a capacitor,
a current source being coupled across said capacitor, and
a transistor being coupled to the output node, said capacitor and the differential input stage.

19. A circuit comprising:

a first current source;

a differential input stage including first and second inputs controlling first and second transistors which are coupled to said first current source so that the current of said first current source equals the sum of the currents in the first and second transistors, the first and second transistors being coupled to first and second nodes respectively which are coupled to first and second current mirroring transistors respectively to mirror the current through the second current mirror transistor to the first current mirror transistor;

an output circuit having an output node responsive to the voltage of the first node; and, an overshoot compensation circuit being coupled between the output circuit and the second node of the differential input stage and responsive to a change in a voltage applied to the output node greater than a predetermined change and rate of change in the voltage applied to the output node greater than a predetermined rate to feed back a current to the second node to limit the magnitude of a net current into the first node thereby limiting slewing of the voltage of the first node, said overshoot compensation circuit includes
a capacitor,
a second current source being coupled across the capacitor, and
a third transistor being coupled to the output node, the capacitor and the second node.

* * * * *